(12) United States Patent
Jeong et al.

(10) Patent No.: US 8,832,638 B2
(45) Date of Patent: Sep. 9, 2014

(54) PACKAGE TEST DEVICES HAVING A PRINTED CIRCUIT BOARD

(71) Applicant: Samsung Electronics Co., Ltd., Suwon-si (KR)

(72) Inventors: Jae-Hoon Jeong, Hwaseong-si (KR); Chang-Woo Ko, Seoul (KR); Ki-Jae Song, Paju-si (KR); Hun-Kyo Seo, Chungcheongnam-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/780,891

(22) Filed: Feb. 28, 2013

(65) Prior Publication Data
US 2013/0176045 A1 Jul. 11, 2013

Related U.S. Application Data

(62) Division of application No. 12/829,921, filed on Jul. 2, 2010, now Pat. No. 8,407,659.

(30) Foreign Application Priority Data

Jul. 3, 2009 (KR) .................. 10-2009-0060821

(51) Int. Cl.
*G06F 17/50* (2006.01)
*G01R 1/04* (2006.01)
*G01R 31/28* (2006.01)
*G11C 29/56* (2006.01)

(52) U.S. Cl.
CPC .......... *G01R 1/0408* (2013.01); *G01R 31/2808* (2013.01); *G06F 17/5068* (2013.01); *G11C 2029/5602* (2013.01); *G11C 29/56* (2013.01)
USPC ............................ 716/137; 716/101; 716/107

(58) Field of Classification Search
USPC .................................................. 716/101, 137
See application file for complete search history.

(56) References Cited

U.S. PATENT DOCUMENTS 7,024,604 B2 * 4/2006 Aoki ............................ 714/720
7,962,320 B2 6/2011 Ogawa et al.

FOREIGN PATENT DOCUMENTS

| JP | 2006-058042 | 3/2006 |
| KR | 1019980071453 | 10/1998 |
| KR | 1020010006760 | 1/2001 |
| KR | 1020050113273 | 12/2005 |
| KR | 1020070065884 | 6/2007 |

* cited by examiner

*Primary Examiner* — Thuan Do
(74) *Attorney, Agent, or Firm* — Myers Bigel Sibley & Sajovec, P.A.

(57) ABSTRACT

In a method of designing a printed circuit board, a package capacitance, a package inductance, and a chip capacitance of an actual memory device are calculated. A signal line capacitance and a signal line inductance per unit length of a signal line are calculated based on characteristics of the printed circuit board. A length of the signal line for each pin is determined based on the package capacitance and the signal line capacitance.

8 Claims, 8 Drawing Sheets

FIG. 3

| SIGNAL | MEMORY DEVICE | | | | PCB | | |
|---|---|---|---|---|---|---|---|
| | R_pkg(ohm) | L_pkg(nH) | C_pkg(pF) | C_chip(pF) | SIG_len(mm) | GND_len(mm) | C_stitch+C_pad(pF) |
| DQ7 | 0.284 | 2.035 | 0.496 | 2.1 | 2.9 | 1.8(0.7nH) | 2.2pF |
| A12 | 0.219 | 2.232 | 0.375 | 1.3 | 2.5 | 2.5(1.0nH) | 1.3pF |
| BA0 | 0.200 | 1.469 | 0.371 | 1.2 | 3.0 | 0.0(0.0nH) | 1.3pF |
| CK | 0.238 | 2.608 | 0.456 | 1.3 | 3.3 | 2.8(1.1nH) | 1.3pF |
| WEB | 0.160 | 1.416 | 0.345 | 1.2 | 3.0 | 0.0(0.0nH) | 1.3pF |
| DQ5 | 0.256 | 2.187 | 0.474 | 2.3 | 2.8 | 2.2(0.9nH) | 2.2pF |

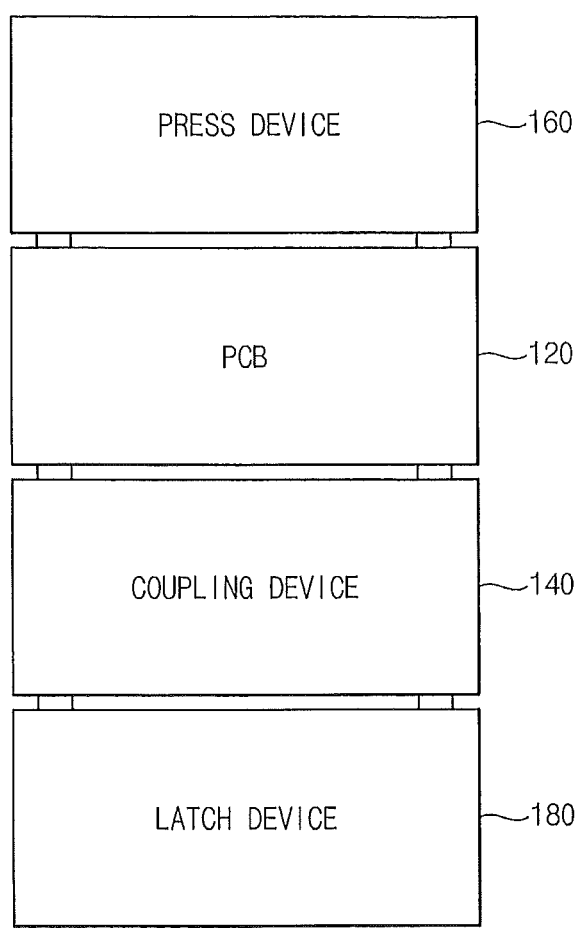

PACKAGE TEST DEVICES HAVING A PRINTED CIRCUIT BOARD

CROSS-REFERENCE TO RELATED APPLICATION(S)

This application is a divisional of U.S. application Ser. No. 12/829,921 filed Jul. 2, 2010 in the United States Patent and Trademark Office, and claims priority to Korean Patent Application No. 10-2009-0060821, filed on Jul. 3, 2009, in the Korean Intellectual Property Office (KIPO), the contents of which are incorporated herein by reference in their entireties.

BACKGROUND

1. Technical Field

Example embodiments relate to a printed circuit board, and more particularly to a method of designing a printed circuit board, and a package test device having the printed circuit board.

2. Description of the Related Art

Generally, a memory device is tested by a memory test device and a pusher device. The memory test device includes an insert device, a test board, and a test socket. The actual memory device is inserted into the insert device. The pusher device presses the insert device to couple the actual memory device in the insert device to the test board through the test socket. When the actual memory device is coupled to the test board, the memory test device outputs test signals to the actual memory device, receives test result signals from the actual memory device, and judges whether the actual memory device is defective by analyzing the test result signals.

However, as the number of test-operations increases, an internal defect such as a defect of the test socket may be caused in the memory test device. As a result, due to the internal defect of the memory test device, the memory test device may misjudge whether the actual memory device is defective. However, conventional methods such as a method of analyzing shmoo data, a method of measuring socket impedance, etc may provide low detection accuracy because test signals inputted into the actual memory device are not exactly measured while the actual memory device is tested.

SUMMARY

Example embodiments provide a method of designing a printed circuit board that substantially has the same operation characteristics as operation characteristics of an actual memory device.

Example embodiments provide a package test device including the printed circuit board.

According to some example embodiments, in a method of designing a printed circuit board, a package capacitance, a package inductance, and a chip capacitance of an actual memory device may be calculated. A signal line capacitance and a signal line inductance per unit length of a signal line may be calculated based on characteristics of the printed circuit board. A length of the signal line for each pin may be determined based on the package capacitance and the signal line capacitance.

In some embodiments, the characteristics of the printed circuit board may include at least one of a topology, a line width, a thickness, and a dielectric material information.

In some embodiments, the length of the signal line for each pin may be determined using the following [Expression 1]:

$$x = C_{PKG}/C_{PCB} \quad \text{[Expression 1]}$$

Here, x denotes the length of the signal line for each pin, $C_{PKG}$ denotes the package capacitance, and $C_{PCB}$ denotes the signal line capacitance.

In some embodiments, in a method of designing a printed circuit board, a ground line inductance per unit length of a ground line may be calculated based on the characteristics of the printed circuit board. A length of the ground line for each pin may be determined based on the package inductance and the ground line inductance.

In some embodiments, the ground line may correspond to a return path for each pin.

In some embodiments, the length of the ground line for each pin may be determined using the following [Expression 2]:

$$y = 0, \quad \text{if } L_{PKG} = x \times L_{PCB} \quad \text{[Expression 2]}$$

$$y = \frac{L_{PKG} - x \times L_{PCB}}{L_{PCB\text{-}RP}}, \quad \text{if } L_{PKG} > x \times L_{PCB}$$

Here, x denotes the length of the signal line for each pin, y denotes the length of the ground line for each pin, $L_{PKG}$ denotes the package inductance, $L_{PCB}$ denotes the signal line inductance, and $L_{PCB\text{-}RP}$ denotes the ground line inductance.

In some embodiments, in a method of designing a printed circuit board, a sum of a pad capacitance and a stitch capacitance for each pin may be determined based on the chip capacitance.

In some embodiments, the sum of the pad capacitance and the stitch capacitance may be determined using the following [Expression 3]:

$$C_{CHIP} = C_{STITCH} + C_{PAD} \quad \text{[Expression 3]}$$

Here, $C_{CHIP}$ denotes the chip capacitance, $C_{STITCH}$ denotes the stitch capacitance, and $C_{PAD}$ denotes the pad capacitance.

In some embodiments, the chip capacitance may be implemented by adding a stitch capacitor for each pin to the printed circuit board.

In some embodiments, the pad capacitance may be determined according to a physical size of the stitch capacitor.

In some embodiments, the stitch capacitance may be determined according to a capacitance of the stitch capacitor.

According to some example embodiments, a package test device may include a printed circuit board substantially having the same operation characteristics as operation characteristics of an actual memory device, a press device that presses the printed circuit board toward a memory test device to couple the printed circuit board to the memory test device, and a coupling device placed between the printed circuit board and the press device that couples the printed circuit board to the memory test device.

In some embodiments, wherein a length of a signal line for each pin in the printed circuit board may be determined using the following [Expression 1]:

$$x = C_{PKG}/C_{PCB} \quad \text{[Expression 1]}$$

Here, x denotes the length of the signal line for each pin, $C_{PKG}$ denotes a package capacitance of the actual memory device, and $C_{PCB}$ denotes a signal line capacitance of the printed circuit board.

In some embodiments, a length of a ground line for each pin in the printed circuit board may be determined using the following [Expression 2]:

$$y = 0, \quad \text{if } L_{PKG} = x \times L_{PCB} \quad \text{[Expression 2]}$$

$$y = \frac{L_{PKG} - x \times L_{PCB}}{L_{PCB\text{-}RP}}, \quad \text{if } L_{PKG} > x \times L_{PCB}$$

Here, x denotes the length of the signal line for each pin, y denotes the length of the ground line for each pin, $L_{PKG}$ denotes a package inductance of the actual memory device, $L_{PCB}$ denotes a signal line inductance of the printed circuit board, and $L_{PCB\text{-}RP}$ denotes the ground line inductance of the printed circuit board.

In some embodiments, a sum of a pad capacitance and a stitch capacitance may be determined using the following [Expression 3]:

$$C_{CHIP} = C_{STITCH} + C_{PAD} \quad \text{[Expression 3]}$$

Here, $C_{CHIP}$ denotes a chip capacitance of the actual memory device, $C_{STITCH}$ denotes a stitch capacitance of the printed circuit board, and $C_{PAD}$ denotes a pad capacitance of the printed circuit board.

In some embodiments, the chip capacitance may be implemented by adding a stitch capacitor for each pin to the printed circuit board. The pad capacitance may be determined according to a physical size of the stitch capacitor. The stitch capacitance may be determined according to a capacitance of the stitch capacitor.

In some embodiments, the package test device may judge whether the memory test device is defective based on input signals that the printed circuit board receives from the memory test device.

In some embodiments, the input signals may be measured by an external measuring device coupled to a connector, the connector being coupled to the stitch capacitor of the printed circuit board.

In some embodiments, the package test device may further include a latch device configured to latch a plurality of actual memory devices to couple the plurality of actual memory devices to the memory test device when the printed circuit board is coupled to the memory test device.

According to some example embodiments, a printed circuit board designed by a method of designing a printed circuit board may substantially have the same operation characteristics as operation characteristics of an actual memory device. Thus, the printed circuit board may be used to detect an internal defect of a memory test device.

According to some example embodiments, a package test device may detect an internal defect of a memory test device by measuring input signals (i.e., test signals) outputted from the memory test device.

BRIEF DESCRIPTION OF THE DRAWINGS

Illustrative, non-limiting example embodiments will be more clearly understood from the following detailed description taken in conjunction with the accompanying drawings.

FIG. 3 is a table illustrating an example case in which a length of a signal line, a length of a ground line, and a sum of a pad capacitance and a stitch capacitance are determined for each pin by the method of FIG. 1.

FIG. 5 is a block diagram illustrating a package test device according to some example embodiments.

DETAILED DESCRIPTION OF THE EMBODIMENTS

Figure 1:
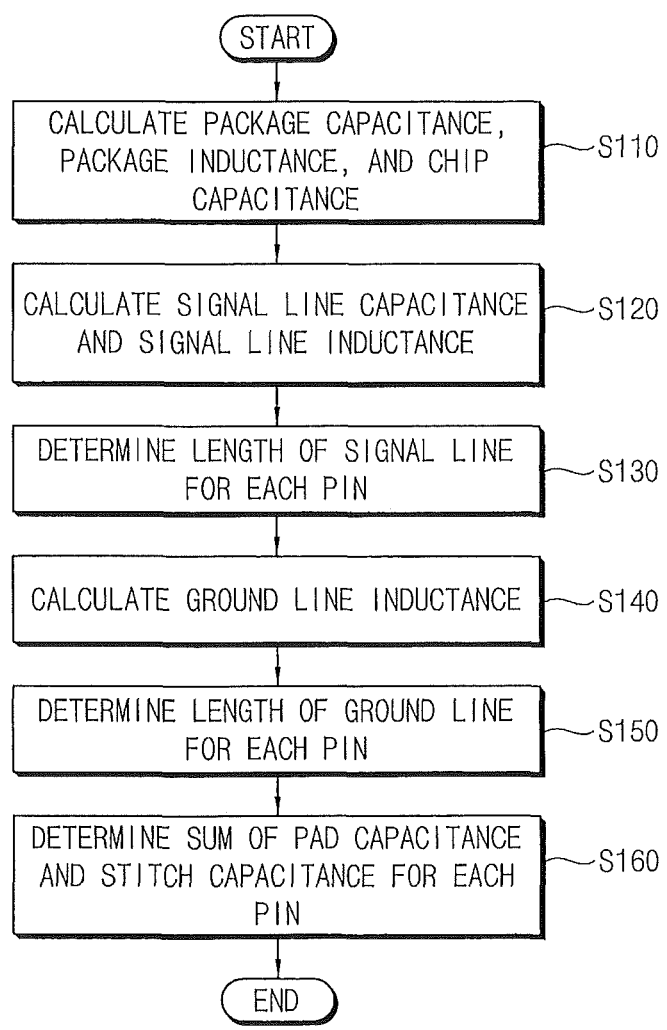
FIG. 1 is a flow chart illustrating a method of designing a printed circuit board according to some example embodiments.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this disclosure will be thorough and complete, and will fully convey the scope of the present inventive concept to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a flow chart illustrating a method of designing a printed circuit board according to some example embodiments.

Referring to FIG. 1, in the method of designing a printed circuit board, a package capacitance, a package inductance, and a chip capacitance of an actual memory device may be calculated (Step S110). A signal line capacitance and a signal line inductance per unit length of a signal line may be calculated based on characteristics of the printed circuit board (Step S120). A length of the signal line for each pin may be determined based on the package capacitance and the signal line capacitance (Step S130). A ground line inductance per unit length of a ground line may be calculated based on the characteristics of the printed circuit board (Step S140). A length of the ground line for each pin may be determined based on the package inductance and the ground line inductance (Step S150). Here, the ground line may correspond to a return path. A sum of a pad capacitance and a stitch capacitance for each pin may be determined based on the chip capacitance (Step S160).

The actual memory device includes a package and a chip. Each of the package and the chip has characteristics such as a resistance, an inductance, a capacitance, etc. In the method of designing a printed circuit board, the package capacitance, the package inductance, and the chip capacitance of the actual memory device are calculated (Step S110). In an example embodiment, the package capacitance, the package inductance, and the chip capacitance of the actual memory device may be calculated by performing a direct measurement on the actual memory device, or by performing a simulation on the actual memory device. The simulation (or, the direct measurement) may be performed using various tolls such as a computer software program. Although the actual memory device includes various characteristics, the package capacitance, the package inductance, and the chip capacitance of the actual memory device are only used in the method of designing a printed circuit board. That is, the package resistance of the actual memory device may be ignored because the package resistance of the actual memory device has relatively small value compared to the package capacitance, the package inductance, and the chip capacitance of the actual memory device.

After the package capacitance, the package inductance, and the chip capacitance of the actual memory device are calculated (Step S110), the signal line capacitance and the signal line inductance per unit length of the signal line are calculated based on characteristics of the printed circuit board (Step S120). The printed circuit board includes various characteristics such as a topology, a line width, a thickness, a dielectric material information, etc. Preferably, the printed circuit board may have an external layer wiring structure. For example, the line width may be 100 μm that is a minimum process capable length of line. The thickness may be 0.6 mm that is a minimum process capable height of via. However, the characteristics of the printed circuit board are not limited thereto. In an example embodiment, the signal line capacitance and the signal line inductance may be calculated using various tools such as a computer software program (e.g., a line moduler HSPICE 2D).

After the package capacitance and the signal line capacitance are calculated in Step S110 and Step S120, the length of the signal line for each pin (e.g., ADD, CTRL, DQ, etc) is determined based on the package capacitance and the signal line capacitance (Step S130). In an exemplary embodiment, the length of the signal line for each pin may be determined using the following [Expression 1]:

$$x = C_{PKG}/C_{PCB} \qquad \text{[Expression 1]}$$

Here, x denotes the length of the signal line for each pin, $C_{PKG}$ denotes the package capacitance, and $C_{PCB}$ denotes the signal line capacitance. Since [Expression 1] is an exemplary embodiment, [Expression 1] may be modified according to required conditions.

As shown in [Expression 1], the package capacitance $C_{PKG}$ has a value (i.e., $x \times C_{PCB}$) generated by multiplying the length x of the signal line for each pin by the signal line capacitance $C_{PCB}$. However, the package inductance $L_{PKG}$ may have a value (i.e., $x \times L_{PCB}$) generated by multiplying the length x of the signal line for each pin by the signal line inductance $L_{PCB}$, or a value greater than the value (i.e., $x \times L_{PCB}$) generated by multiplying the length x of the signal line for each pin by the signal line inductance $L_{PCB}$. Thus, an inductance compensation may be performed on a certain pin when the package inductance $L_{PKG}$ for the certain pin has a value greater than the value of $x \times L_{PCB}$. In an example embodiment, the inductance compensation may be performed by determining the length of the ground line for the certain pin. Thus, the ground line inductance per unit length of the ground line is calculated based on the characteristics of the printed circuit board (Step S140). As described above, the ground line may correspond to the return path. Then, the length of the ground line for each pin is determined based on the package inductance and the ground line inductance (Step S150).

In detail, in the method of designing a printed circuit board, the ground line may be additionally arranged for a first pin of which the package inductance $L_{PKG}$ has the value of $x \times L_{PCB}$. That is, the inductance compensation may not be performed for the first pin because the ground line (i.e., the return path) is unnecessary for the first pin. On the other hand, the ground line may be additionally placed for a second pin of which the package inductance $L_{PKG}$ has a value greater than the value of $x \times L_{PCB}$. That is, the inductance compensation may be performed for the second pin because the ground line (i.e., the return path) is necessary for the second pin. In an exemplary embodiment, the length of ground line for each pin may be determined using the following [Expression 2]:

$$y = 0, \qquad \text{if } L_{PKG} = x \times L_{PCB} \qquad \text{[Expression 2]}$$
$$y = \frac{L_{PKG} - x \times L_{PCB}}{L_{PCB\text{-}RP}}, \quad \text{if } L_{PKG} > x \times L_{PCB}$$

Here, x denotes the length of the signal line for each pin, y denotes the length of the ground line for each pin, $L_{PKG}$ denotes the package inductance, $L_{PCB}$ denotes the signal line inductance, and $L_{PCB\text{-}RP}$, denotes the ground line inductance. Since [Expression 2] is an exemplary embodiment, [Expression 2] may be modified according to required conditions.

Further, the sum of the pad capacitance and the stitch capacitance for each pin is determined based on the chip capacitance (Step S160). The chip capacitance may be implemented by adding a stitch capacitor for each pin to the printed circuit board. In detail, the pad capacitance may be determined according to a physical size of the stitch capacitor, and the stitch capacitance may be determined according to a capacitance of the stitch capacitor. Thus, the sum of the pad capacitance and the stitch capacitance for each pin may be determined by adding a proper stitch capacitor for each pin to the printed circuit board. In an exemplary embodiment, the sum of the pad capacitance and the stitch capacitance may be determined using the following [Expression 3]:

$$C_{CHIP}=C_{STITCH}+C_{PAD}$$ [Expression 3]

Here, $C_{CHIP}$ denotes the chip capacitance, $C_{STITCH}$ denotes the stitch capacitance, and $C_{PAD}$ denotes the pad capacitance.

As described above, the printed circuit board that substantially has the same operation characteristics as operation characteristics of the actual memory device may be designed by determining the length of the signal line, the length of the ground line, and the sum of the pad capacitance and the stitch capacitance. Thus, the printed circuit board operates as the actual memory device when the printed circuit board is coupled to the memory test device, so that the printed circuit board may be used to detect an internal defect of the memory test device. In addition, the length of the signal line, the length of the ground line, and the sum of the pad capacitance and the stitch capacitance may be adjusted based on a check result generated by checking whether operation characteristics of the printed circuit board is substantially the same as operation characteristics of the actual memory device in a frequency domain and in a time domain.

Figure 2A:
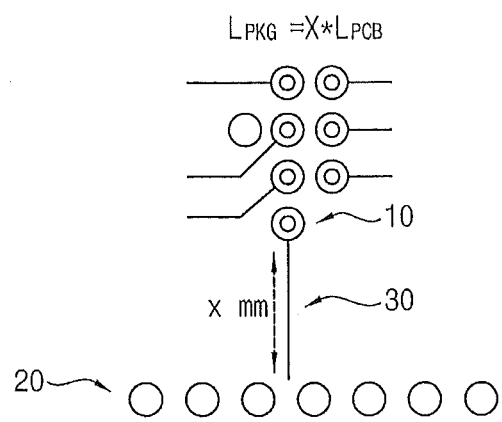
FIG. 2A is a diagram illustrating an example case in which a signal line and a ground line are arranged on a printed circuit board designed by the method of FIG. 1.

FIG. 2A is a diagram illustrating an example case in which a signal line and a ground line are arranged on a printed circuit board designed by the method of FIG. 1. In addition, FIG. 2B is a diagram illustrating another example case in which a signal line and a ground line are arranged on a printed circuit board designed by the method of FIG. 1.

Figure 2B:
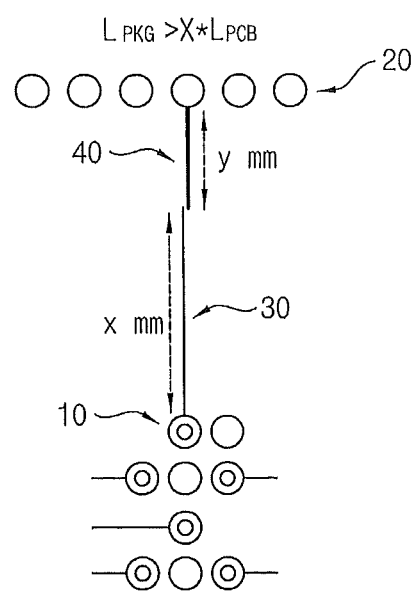
FIG. 2B is a diagram illustrating another example case in which a signal line and a ground line are arranged on a printed circuit board designed by the method of FIG. 1.

Referring to FIGS. 2A and 2B, each circle may indicate via on the printed circuit board. In detail, the first circle 10 may indicate via for the signal line 30, and the second circle 20 may indicate via for the ground line 40. In addition, the signal line 30 may correspond to a signal trace on the printed circuit board, and the ground line 40 may correspond to a ground trace on the printed circuit board.

As illustrated in FIG. 2A, when the value of the package inductance $L_{PKG}$ is the same as the value generated by multiplying the signal line inductance $L_{PCB}$ the length x of the signal line 30 (i.e., $L_{PKG}=x \times L_{PCB}$), the length y of the ground line may be determined as 0. Thus, only the signal line 30 may be arranged on the printed circuit board by the method of FIG. 1. As illustrated in FIG. 2B, when the value of the package inductance $L_{PKG}$ is greater than the value generated by multiplying the signal line inductance $L_{PCB}$ by the length x of the signal line 30 (i.e., $L_{PKG}>x \times L_{PCB}$), the length y of the ground line 40 may be determined as a certain value. Thus, the ground line 40 as well as the signal line 30 may be arranged on the printed circuit board by the method of FIG. 1. Since the wiring structure illustrated in FIG. 2A or in FIG. 2B is an exemplary embodiment, the wiring structure is not limited thereto. That is, by the method of FIG. 1, the inductance compensation may be performed by arranging the ground line 40 as well as the signal line 30 when the expression $L_{PKG}=x \times L_{PCB}$ is not satisfied by arranging the signal line 30.

FIG. 3 is a table illustrating an example case in which a length of a signal line, a length of a ground line, and a sum of a pad capacitance and a stitch capacitance are determined for each pin by the method of FIG. 1.

Referring to FIG. 3, the length of the signal line, the length of the ground line, and the sum of the pad capacitance and the stitch capacitance for each pin (i.e., DQ7, A12, BA0, CK, WEB, DQ5) of the printed circuit board may be designed by the method of FIG. 1. For example, in case of a first pin DQ7 of the actual memory device that has the package resistance R_pkg of 0.284 ohm, the package inductance L_pkg of 2.035 nH, the package capacitance C_pkg of 0.496 pF, and the chip capacitance C_chip of 2.1 pH, the length SIG_len of the signal line may be determined as 2.9 mm, the length GND_len of the ground line may be determined as 1.8 mm, and the sum of the pad capacitance C_pad and the stitch capacitance C_stitch may be determined (i.e., by adding the proper stitch capacitor to the printed circuit board) as about 2.1 pF corresponding to the chip capacitance C_chip. As described above, the ground line may correspond to the return path. Thus, since the length GND_len of the ground line is determined as 1.8 mm, the inductance of 0.7 nH may be compensated by the ground line (i.e., the return path).

As described above, the printed circuit board having the same operation characteristics as operation characteristics of the actual memory device may be designed by the method of FIG. 1. That is, operation characteristics of the printed circuit board coupled to the memory test device is substantially the same as operation characteristics of the actual memory device coupled to the memory test device. Thus, the printed circuit board may be used to detect the internal defect of the memory test device by being coupled to the memory test device instead of the actual memory device. Here, the internal defect of the memory test device may be detected by analyzing input signals (i.e., test signals) that the printed circuit board receives from the memory test device.

FIGS. 4A through 4D are graphs illustrating comparison results between operation characteristics of an actual memory device and operation characteristics of a printed circuit board designed by the method of FIG. 1.

Figure 4A:
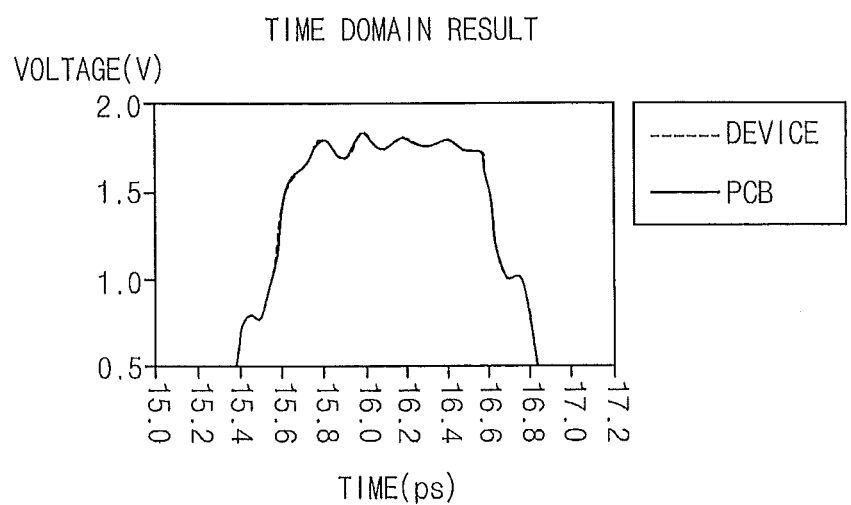
FIGS. 4A through 4D are graphs illustrating comparison results between operation characteristics of an actual memory device and operation characteristics of a printed circuit board designed by the method of FIG. 1.
Figure 4B:
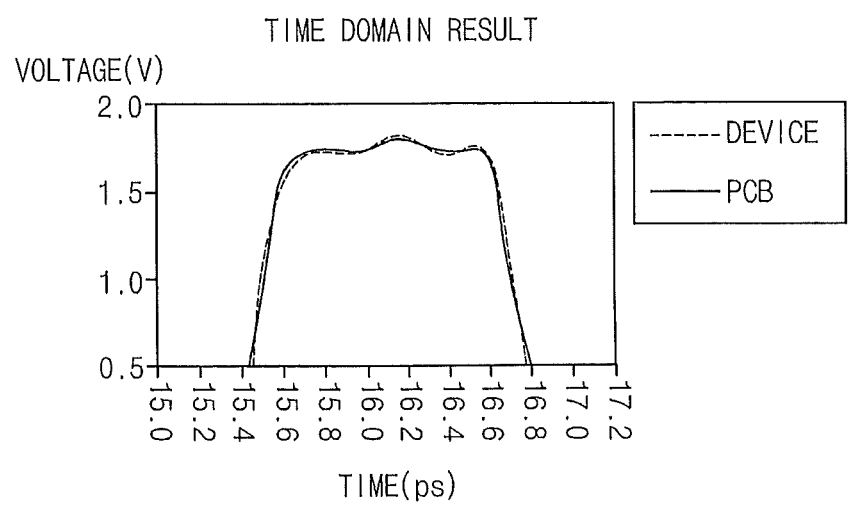
Figure 4C:
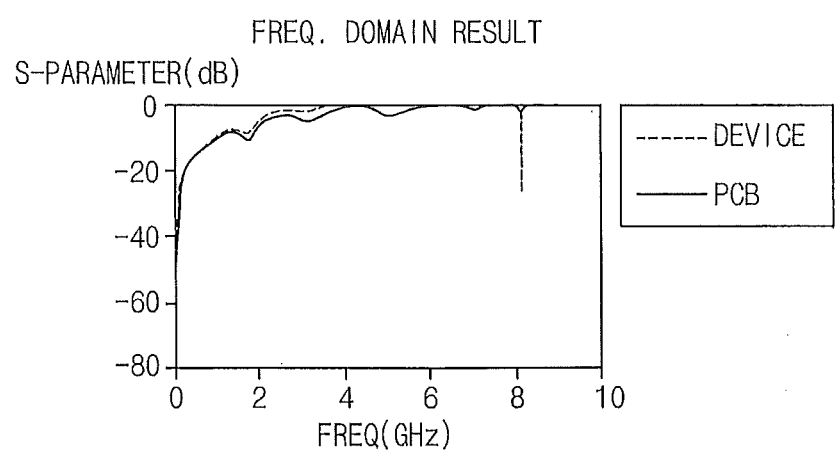
Figure 4D:
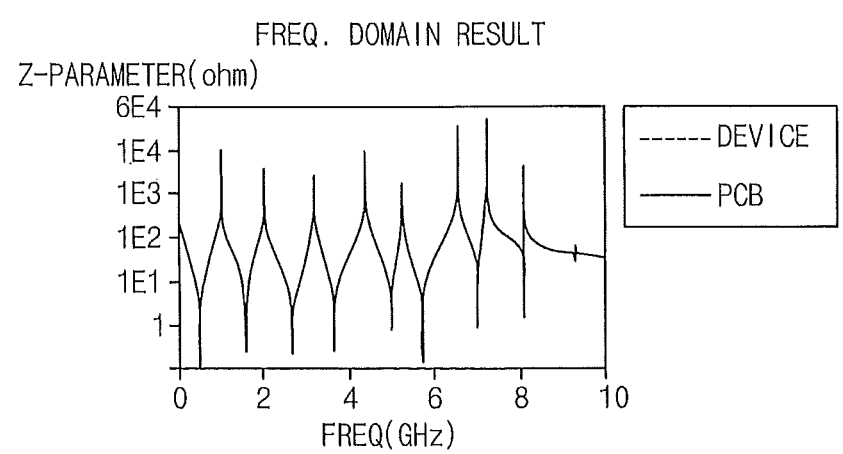

Referring to FIGS. 4A and 4D, a first line indicates operation characteristics of the actual memory device DEVICE coupled to the memory test device, and a second line indicates operation characteristics of the printed circuit board PCB (i.e., designed by the method of FIG. 1) coupled to the memory test device.

The graph of FIG. 4A indicates a voltage measured at a package ball terminal for the first pin DQ7 in the time domain. The graph of FIG. 4B indicates a voltage measured at a package wirebond terminal for the first pin DQ7 in the time domain. As illustrated in FIGS. 4A and 4B, operation characteristics of the actual memory device coupled to the memory test device is substantially the same as operation characteristics of the printed circuit board coupled to the memory test device in the time domain. The difference between operation characteristics of the actual memory device and operation characteristics of the printed circuit board is within a margin of error of 2.8% (e.g., overshoot/undershoot).

The graph of FIG. 4C indicates S-parameter measured for the first pin DQ7 in the frequency domain. The graph of FIG. 4D indicates Z-parameter measured for the first pin DQ7 in the frequency domain. Here, the Z-parameter corresponds to input impedance, and the S-parameter corresponds to a voltage ratio between an input voltage and an output voltage. As illustrated in FIGS. 4C and 4D, operation characteristics of the actual memory device coupled to the memory test device is substantially the same as operation characteristics of the printed circuit board coupled to the memory test device in the frequency domain. The difference between operation characteristics of the actual memory device and operation characteristics of the printed circuit board is within a margin of error of 10GHz.

As described above, operation characteristics of the printed circuit board coupled to the memory test device is substantially the same as operation characteristics of the actual memory device coupled to the memory test device. Thus, the printed circuit board may be used to detect the internal defect of the memory test device by being coupled to the memory test device instead of the actual memory device.

FIG. 5 is a block diagram illustrating a package test device according to some example embodiments.

Referring to FIG. 5, the package test device 100 may include a printed circuit board (PCB) 120, a coupling device 140, and a press device 160. In addition, the package test device 100 may further include a latch device 180.

The printed circuit board 120 may be designed based on a package capacitance, a package inductance, and a chip capacitance of an actual memory device. In detail, the package capacitance, the package inductance, and the chip capacitance are calculated based on characteristics of the actual memory device. In addition, a signal line capacitance, a signal line inductance, and a ground line inductance are calculated based on characteristics of the printed circuit board 120. Then, a length of a signal line for each pin is determined based on the package capacitance and the signal line capacitance, and a length of a ground line for each pin is determined based on the package inductance and the ground line inductance. A sum of a pad capacitance and a stitch capacitance for each pin is determined based on a chip capacitance. In an exemplary embodiment, the length of the signal line for each pin may be determined using [Expression 1]. The length of ground line for each pin may be determined using [Expression 2]. The sum of the pad capacitance and the stitch capacitance for each pin may be determined using [Expression 3]. Since a method of designing the printed circuit board 120 is described above, the detailed description of the method of designing the printed circuit board 120 will be omitted.

The coupling device 140 may couple the printed circuit board 120 to the memory test device. That is, the printed circuit board 120 is coupled to the memory test device instead of the actual memory device in order to detect an internal defect of the memory test device. That is, the coupling device 140 is placed between the printed circuit board 120 and the memory test device, so that the coupling device 140 may transfer electric signals between the printed circuit board 120 and the memory test device. In an exemplary embodiment, the coupling device 140 may include an interposer guide having an interposer. The press device 160 may press the printed circuit board 120 toward the memory test device to couple the printed circuit board 120 to the memory test device. That is, the printed circuit board 120 may be coupled to the memory test device through the coupling device 140. In an exemplary embodiment, the press device 160 may include a spring for providing a pressure on the printed circuit board 120, and a device fixing handle.

The latch device 180 may latch a plurality of actual memory devices. Thus, the actual memory devices and the printed circuit board 120 may be coupled to the memory test device. Generally, when a memory test device simultaneously performs a test operation on a plurality of memory devices, the memory devices are electrically coupled to the memory test device through one pin of the memory test device. Thus, open-load phenomenon may occur if at least one of the memory devices is defective. As a result, the at least one defective memory device may influence on the test operation of other memory devices. In order to couple the memory test device to the actual memory devices as well as the printed circuit board 120, the package test device 100 may include the latch device 160 that latches the actual memory devices. That is, the actual memory devices may be inserted in the latch device 160. Then, the package test device 100 may analyze noise interferences among the memory devices according to the number of the defective memory devices based on the test operation of the actual memory devices and the printed circuit board 120 coupled to the memory test device 190.

As described above, the printed circuit board 120 is designed to substantially have the same operation characteristics as operation characteristics of the actual memory device. Thus, the printed circuit board 120 may substantially operate as the actual memory device when the printed circuit board 120 is coupled to the memory test device instead of the actual memory device, so that the printed circuit board 120 may be used to detect the internal defect of the memory test device. In addition, the package test device 100 may couple the actual memory devices as well as the printed circuit board 120 to the memory test device. Thus, the package test device 100 may analyze the noise interferences among the memory devices according to the number of the defective memory devices based on the test operation of the actual memory devices and the printed circuit board 120. In an exemplary embodiment, the internal defect of the memory test device may be detected based on input signals (i.e., test signals) that the printed circuit board 120 receives from the memory test device. The input signals (i.e., test signals) may be measured by an external measuring device coupled to a connector that is coupled to a stitch capacitor of the printed circuit board 120.

Figure 6:
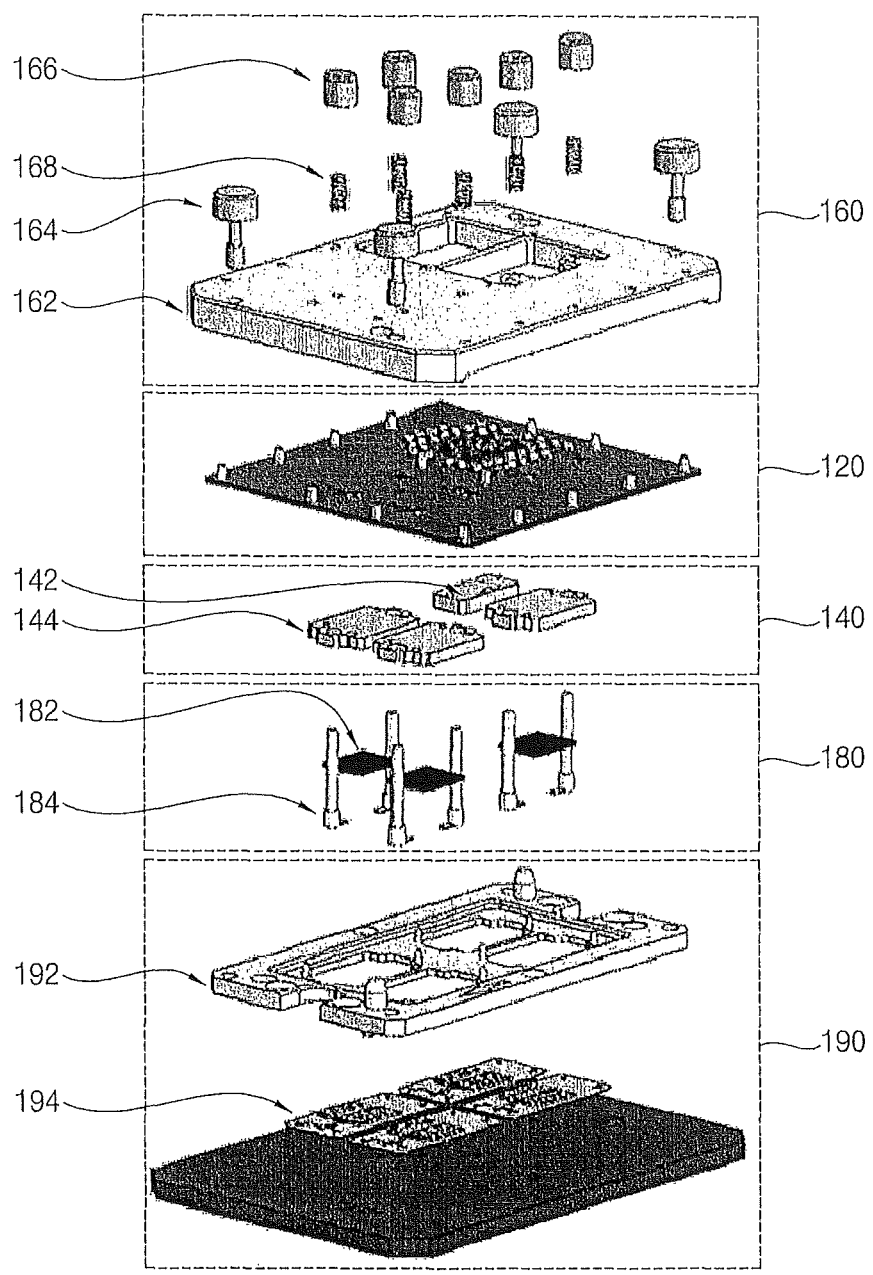
FIG. 6 is a diagram illustrating an example case in which a package test device of FIG. 5 is coupled to a memory test device.

FIG. 6 is a diagram illustrating an example case in which a package test device of FIG. 5 is coupled to a memory test device.

Referring to FIG. 6, the package test device 100 including the printed circuit board 120, the coupling device 140, the press device 160, and the latch device 180 may detect the internal defect such as the defect of the test socket in the memory test device 190 by using the printed circuit board 120 coupled to the memory test device 190.

The printed circuit board 120 may be placed between the press device 160 and the coupling device 140. The printed circuit board 120 is designed based on the package capacitance, the package inductance, and the chip capacitance of the actual memory device, so that the printed circuit board 120 substantially may have the same operation characteristics of operation characteristics of the actual memory device. That is, the length of the signal line for each pin, the length of the ground line for each pin, and the sum of the pad capacitance and the stitch capacitance for each pin in the printed circuit board 120 are determined based on the package capacitance, the package inductance, and the chip capacitance of the actual memory device. The stitch capacitor of the printed circuit board 120 may be coupled to the connector through which the external measuring device measures the input signals (i.e., the test signals) that the printed circuit board 120 receives from the memory test device 190. Then, the internal defect such as the defect of the test socket in the memory test device 190 may be detected by analyzing the input signals measured by the external measuring device.

The coupling device 140 may be placed between the printed circuit board 120 and the memory test device 190. The coupling device 140 physically couples the printed circuit board 120 to the memory test device 190, so that the printed circuit board 120 may be electrically coupled to the memory test device 190. In an example embodiment, the coupling device 140 may include the interposer guide 142 for coupling the printed circuit board 120 to the memory test device 190. In addition, the interposer guide 142 may include the interposer for transferring electrical signals between the printed circuit board 120 and the memory test device 190. In an example embodiment, the coupling device 140 may further include a plurality of device guides 144 for fixing the actual memory devices 182 when the package test device 100 includes the latch device 180. For example, the interposer in the interposer guide 142 may be made of gold for improving electric transference characteristics of the interposer. The interposer in the interposer guide 142 may include a coupling part in upper region and a body part in lower region. The coupling part of the interposer may be implemented in a slip-metal shape, so that the coupling part of the interposer may be soldered after being inserted into via. The body part of the interposer may be coupled to the socket of the memory test device 190, so that the electrical signals may be transferred between the printed circuit board 120 and the memory test device 190 by the interposer.

The press device 160 may be placed over the printed circuit board 120. The press device 160 presses the printed circuit board 120 toward the memory test device 190 to couple the printed circuit board 120 to the memory test device 190 through the coupling device 140. Generally, the actual memory device should be electrically coupled to the memory test device 190 for the test. Thus, the actual memory device may be pressed toward the memory test device 190. For example, the actual memory device may be electrically coupled to the memory test device 190 when the socket of the memory test device 190 is pushed by about 0.25 mm as the actual memory device is pressed toward the memory test device 190. In an exemplary embodiment, the press device 160 may include a guide block 162, a fixing bolt 164, a device fixing handle 166, and a spring 168. The fixing bolt 164 is used to couple the guide block 162 to the socket guide 192 of the memory test device 190. The device fixing handle 166 is coupled to the guide block 162 through the spring 168, so that the device fixing handle 166 may control the pressure for pressing the printed circuit board 120 toward the memory test device 190.

The latch device 180 may be placed between the coupling device 140 and the memory test device 190. The latch device 180 latches the actual memory devices 182, so that the actual memory devices 182 may be coupled to the memory test device 190 when the printed circuit board 120 is coupled to the memory test device 190. In an exemplary embodiment, the latch device 180 may include a device latching handle 184. The device latching handle 184 is coupled to the device guide 144 of the coupling device 140, so that the actual memory devices 182 may be latched by the device latching handle 184 and the device guide 144. For example, three actual memory devices 182 may be contained in the latch device 180 as illustrated in FIG. 6. As a result, the printed circuit board 120 and three actual memory devices 182 is coupled to the memory test device 190, simultaneously. Thus, the package test device 100 may analyze noise interferences among memory devices according to the number of defective memory devices.

Figure 7:
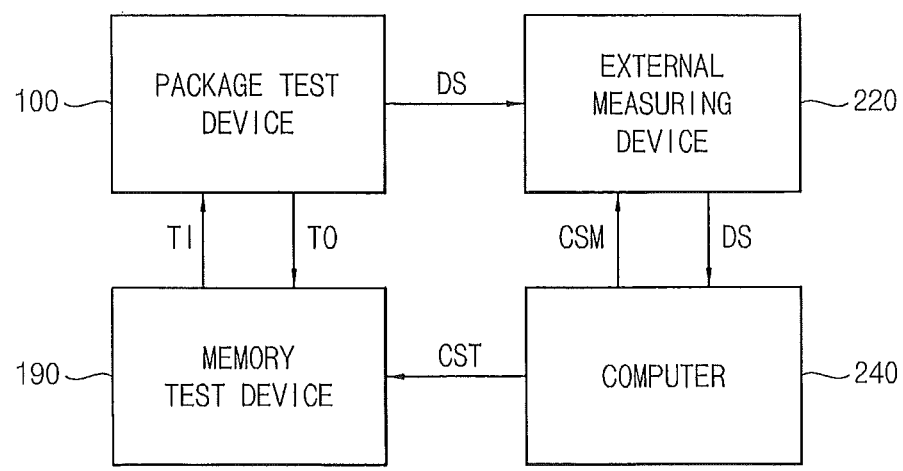
FIG. 7 is a block diagram illustrating an example case in which a package test device of FIG. 5 is used to detect an internal defect of a memory test device.

FIG. 7 is a block diagram illustrating an example case in which a package test device of FIG. 5 is used to detect an internal defect of a memory test device.

Referring to FIG. 7, the internal defect of the memory test device 190 may be detected by interactions among the package test device 100, the memory test device 190, the external measuring device 220, and the computer 240.

The package test device 100 may be coupled to the memory test device 190, so that the package test device 100 may check whether the memory test device 190 includes the internal defect based on the input signals (i.e., the test signals) TI. The external measuring device 220 such as an oscilloscope may measure the input signals TI that the memory test device 190 outputs to the package test device 100, so that the internal defect such as the defect of the socket of the memory test device 190 may be detected. The external measuring device 220 may receive measuring signals DS corresponding to the input signals TI that the memory test device 190 outputs to the package test device 100, and may output the measuring signals DS to the computer 240. The computer 240 may analyze the measuring signals DS to detect the internal defect of the memory test device 190, and may determine whether the internal defect of the memory test device 190 exists based on the measuring signals DS. In addition, the computer 240 may output control signals CST and CSM to the memory test device 190 and the external measuring device 220, respectively. That, operations of the memory test device 190 and the external measuring device 200 may be controlled by the computer 240. Here, the computer 240 indicates a system for controlling the operations of the memory test device 190 and the external measuring device 200, and for analyzing the measuring signals DS corresponding to the input signals TI that the memory test device 190 outputs to the package test device 100. Therefore, the computer 240 is not limited to a certain computer such as a personal computer, laptop computer, etc.

As described above, by a method of designing a printed circuit board, a printed circuit board having the same operation characteristics as an actual memory device may be designed. Thus, an internal defect of a memory test device may be detected by coupling the printed circuit board to the memory test device. In addition, a package test device having the printed circuit board may detect the internal defect of the memory test device. Therefore, the present inventive concept may be applied to various technical arts such as a memory test device development, a test process improvement, etc. The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A package test device, comprising:
   a printed circuit board having operation characteristics based on operation characteristics of an actual memory device including package capacitance, package inductance and chip capacitance of the actual memory device;
   a press device configured to press the printed circuit board toward a memory test device to couple the printed circuit board to the memory test device; and
   a coupling device placed between the printed circuit board and the press device, the coupling device being configured to couple the printed circuit board to the memory test device, wherein a signal line capacitance and a signal line inductance per unit length of a signal line are calculated based on the operation characteristics of the printed circuit board, and wherein a length of the signal line for each pin is determined based on the package capacitance and the signal line capacitance.

2. The device of claim 1, wherein the length of the signal line for each pin in the printed circuit board is determined using the following [Expression 1]:

$$x = C_{PKG}/C_{PCB} \qquad \text{[Expression 1]}$$

where, x denotes the length of the signal line for each pin, $C_{PKG}$ denotes the package capacitance of the actual memory device, and $C_{PCB}$ denotes the signal line capacitance of the printed circuit board.

3. The device of claim 2, wherein a length of a ground line for each pin in the printed circuit board is determined using the following [Expression 2]:

$$y = 0, \quad \text{if } L_{PKG} = x \times L_{PCB} \quad \text{[Expression 2]}$$

$$y = \frac{L_{PKG} - x \times L_{PCB}}{L_{PCB\text{-}RP}}, \quad \text{if } L_{PKG} > x \times L_{PCB}$$

where, x denotes the length of the signal line for each pin, y denotes the length of the ground line for each pin, $L_{PKG}$ denotes the package inductance of the actual memory device, $L_{PCB}$ denotes the signal line inductance of the printed circuit board, and $L_{PCB\text{-}RP}$ denotes a ground line inductance of the printed circuit board.

4. The device of claim 3, wherein a sum of a pad capacitance and a stitch capacitance is determined using the following [Expression 3]:

$$C_{CHIP} = C_{STITCH} + C_{PAD} \quad \text{[Expression 3]}$$

where, $C_{CHIP}$ denotes the chip capacitance of the actual memory device, $C_{STITCH}$ denotes the stitch capacitance of the printed circuit board, and $C_{PAD}$ denotes the pad capacitance of the printed circuit board.

5. The device of claim 4, wherein the chip capacitance is implemented by adding a stitch capacitor for each pin to the printed circuit board, the pad capacitance being determined according to a physical size of the stitch capacitor, and the stitch capacitance being determined according to a capacitance of the stitch capacitor.

6. The device of claim 5, wherein the package test device is configured to determine whether the memory test device is defective based on input signals that the printed circuit board receives from the memory test device.

7. The device of claim 6, wherein the input signals are measured by an external measuring device coupled to a connector, the connector being coupled to the stitch capacitor of the printed circuit board.

8. The device of claim 1, further comprising:
a latch device configured to couple a plurality of actual memory devices to the memory test device when the printed circuit board is coupled to the memory test device, wherein the plurality of actual memory devices have the operation characteristics of the actual memory device.

* * * * *